(12) United States Patent
Lazarovich et al.

(10) Patent No.: US 8,330,413 B2
(45) Date of Patent: Dec. 11, 2012

(54) METHOD AND SYSTEM FOR DETERMINING AND CHARGING LI-ION BATTERY IN AN INTEGRATED POWER SYSTEM

(75) Inventors: David Lazarovich, Thornhill (CA); Ileana Rusan, Toronto (CA); Rodney Michalko, Ridgeville (CA)

(73) Assignee: Honeywell International Inc., Morristown, NJ (US)

( * ) Notice: Subject to any disclaimer, the term of this patent is extended or adjusted under 35 U.S.C. 154(b) by 403 days.

(21) Appl. No.: 12/395,296

(22) Filed: Feb. 27, 2009

(65) Prior Publication Data

US 2009/0309551 A1 Dec. 17, 2009

Related U.S. Application Data

(60) Provisional application No. 61/060,950, filed on Jun. 12, 2008.

(51) Int. Cl.
*H02J 7/00* (2006.01)
(52) U.S. Cl. ........................................ 320/107; 320/148
(58) Field of Classification Search .................. None
See application file for complete search history.

(56) References Cited

U.S. PATENT DOCUMENTS

| | | | | |
|---|---|---|---|---|
| 5,710,506 | A * | 1/1998 | Broell et al. | 320/145 |
| 5,977,749 | A * | 11/1999 | Kim | 320/128 |
| 6,301,893 | B1 * | 10/2001 | Luo | 60/641.1 |
| 6,335,574 | B1 * | 1/2002 | Ochiai et al. | 290/40 C |
| 6,727,670 | B1 | 4/2004 | Grabowski et al. | |
| 6,765,306 | B2 * | 7/2004 | Fattic | 320/110 |
| 7,098,636 | B2 | 8/2006 | Koerner et al. | |
| 7,324,902 | B2 | 1/2008 | Verbrugge et al. | |
| 2002/0074863 | A1 * | 6/2002 | Turvey | 307/87 |
| 2004/0130294 | A1 * | 7/2004 | Ng et al. | 320/128 |
| 2006/0237246 | A1 | 10/2006 | Severinsky et al. | |
| 2007/0013333 | A1 * | 1/2007 | Ajima et al. | 318/432 |
| 2007/0080664 | A1 * | 4/2007 | Maguire et al. | 320/116 |
| 2008/0129252 | A1 * | 6/2008 | Nishino | 320/162 |

\* cited by examiner

*Primary Examiner* — Drew A Dunn
*Assistant Examiner* — Robert Grant
(74) *Attorney, Agent, or Firm* — Shimokaji & Assoc., PC

(57) ABSTRACT

A method and apparatus of determining the state of charge and charging Li-ion batteries while the batteries remain floating on the direct current (DC) bus without the need for a dedicated charger is described. The system includes a battery, a DC generator and a converter, each electrically connected to a DC bus. A charging control algorithm may be used to monitor and control the charging current supplied to the battery. The voltage on the DC bus may be varied to help control the charging current supplied to the battery, based on the battery's internal impedance and the battery's state of charge.

15 Claims, 3 Drawing Sheets

METHOD AND SYSTEM FOR DETERMINING AND CHARGING LI-ION BATTERY IN AN INTEGRATED POWER SYSTEM

RELATED APPLICATIONS

The present application claims benefit of U.S. Provisional Application No. 61/060,950 filed Jun. 12, 2008.

BACKGROUND OF THE INVENTION

The present invention relates to a method and system for determining the state of charge and defining a charging algorithm for lithium ion (Li-ion) batteries and more particularly, to a method and system of determining and charging Li-ion batteries while the batteries remain floating on the direct current (DC) bus without the need for a dedicated charger.

Lithium Ion batteries integrated in an electrical power system need to be charged in a short time and in a way that guarantees their safe and optimal charging. Present methods include charging batteries via dedicated chargers, internal or external to the batteries and the battery envelope or external to the battery.

Li-Ion batteries are an emerging technology in the area of energy storage. Due to their particular chemistry and build, this emerging technology imposes more stringent methods of charging and discharging to ensure that operation safety margins are maintained. In addition, it is necessary to accurately determine the state of charge (SOC) of a Li-Ion battery in order to be aware of the reserves of stored energy in the system and to adapt the necessary measures as a result. When at a low SOC, the charging process must be re-started.

With respect to the charging process, a Li-Ion battery should not be charged beyond a certain limit. The charging current delivered to a Li-ion should be limited at the commencement of the start of charging and also when the battery approaches fully charge state. In addition, internal parameters of the battery, i.e., cell temperature, voltage, voltage balance between the different cells that constitute the battery, should be monitored and action taken if limits are exceeded.

As can be seen, there is a need for a system and method for accurately determining the SOC of a battery and safely charging the battery in an integrated power system.

SUMMARY OF THE INVENTION

In one aspect of the present invention an apparatus for monitoring and charging a battery in an integrated power system, the apparatus comprises a battery electrically connected to a DC bus; a DC generator electrically connected to the DC bus; and a converter electrically connected to the DC bus, wherein the battery is charged while floating on the DC bus, and wherein a dedicated battery charger is not required to charge the battery.

In another aspect of the present invention, an apparatus for monitoring and charging a battery in an integrated power system comprises an external power source providing a first source of power; a converter connected to said first power source to convert the external power source into a direct current; a direct current bus connected to the converter to receive the first source of power; a direct current generator also connected to the direct current bus providing a second source of power; and a generator control unit connected to the direct current generator to control the second source of power; wherein a charging algorithm used to charge the battery is implemented in the generator control unit or said converter, or both.

In a further aspect of the present invention, a method for charging a battery in an integrated power system comprises regulating a charging current to a constant predetermined maximum value by decreasing a voltage level on a DC bus; supplying the charging current to the battery until a state of charge of the battery reaches a predetermined value while increasing the voltage level as the internal impedance of the battery increases; reducing the charging current to the battery while maintaining a constant voltage on the DC bus after the state of charge of the battery surpasses the predetermined value; and discontinuing charging of the battery when the charging current decreases to a value of about 1% of the battery nominal amp-hour capacity.

These and other features, aspects and advantages of the present invention will become better understood with reference to the following drawings, description and claims.

DETAILED DESCRIPTION OF THE INVENTION

Figure 1:
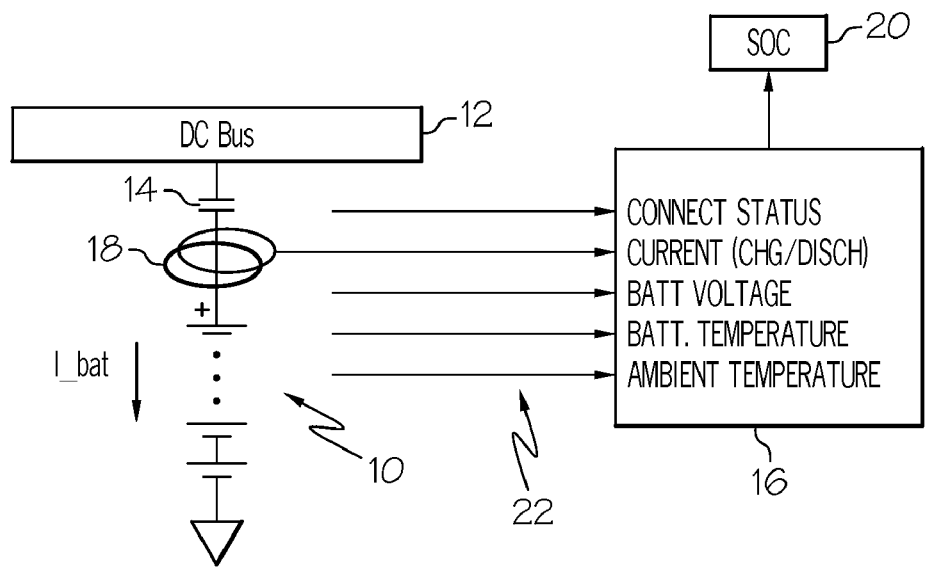
FIG. 1 shows a battery monitoring and SOC set up, used to determine the SOC of a battery according to an embodiment of the present invention.

The following detailed description is of the best currently contemplated modes of carrying out exemplary embodiments the invention. The description is not to be taken in a limiting sense, but is made merely for the purpose of illustrating the general principles of the invention, since the scope of the invention is best defined by the claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

Broadly, embodiments of the present invention provide methods of determining the state of charge of a Li-Ion battery based on the monitoring of a balance of currents into and out of the battery, the terminals voltage of the battery during charging and discharging, and the terminals voltage of the battery during open circuit, i.e., non connected. The results of the above three measurements and monitoring processes are complementary and when taken in conjunction may allow the determination of the state of charge of the battery. For the determination of the SOC of the battery, a current sensor and/or a plurality of current sensors may report the battery current to the computational device housing the algorithms which determine the SOC of the battery. In addition, the terminal voltage of the battery and temperature information of the battery cells/packs may also reported to the device. The computational device may be a microprocessor.

In addition, embodiments of the present invention also provide methods of charging Li-Ion batteries serving as energy storage components in a power system. The power system may be, for example, incorporated into a ground vehicle. The sources for charging the battery may be the main vehicle generator or an auxiliary generator supplying power directly to the DC bus or via conversion equipment. In the process of charging a battery from a low state of charge, the battery may absorb a very high current due to its very low internal impedance. This current may reach unsafe values; therefore the current should be limited. In addition, while approaching the fully charged state, the charging current should be stopped in order not to overcharge the battery.

The charging method described below, according to an exemplary embodiment of the present invention, may take advantage of the control system resources in the vehicle as well as of the voltage regulation capabilities built into the generator control units (GCUs) or the conversion units. In this way, the battery may be charged directly while floating on the DC bus fed by either a generator or a converter. This method of charging may not require dedicated chargers. In addition to eliminating the need for dedicated chargers, by having the battery directly floating on the bus, the quality of the power on the bus may be improved.

Referring to FIG. 1, there is shown a schematic drawing of a battery monitoring and state of charge determination set up according to an embodiment of the present invention. A battery 10 may be connected to a DC bus 12 via a contactor 14. A computational device 16, such as a microprocessor, may receive various inputs from the battery 10, such as ambient temperature, battery temperature, and battery voltage. A current sensor 18 may send a charge/discharge current measurement signal to the computational device 16. The contactor 14 may also send a signal to the computational device 16, the signal depicting the connect status of the battery 10 to the DC bus 12. A SOC 20 of the battery 10 may be determined based on information 22 supplied to the computational device 16.

Figure 2:
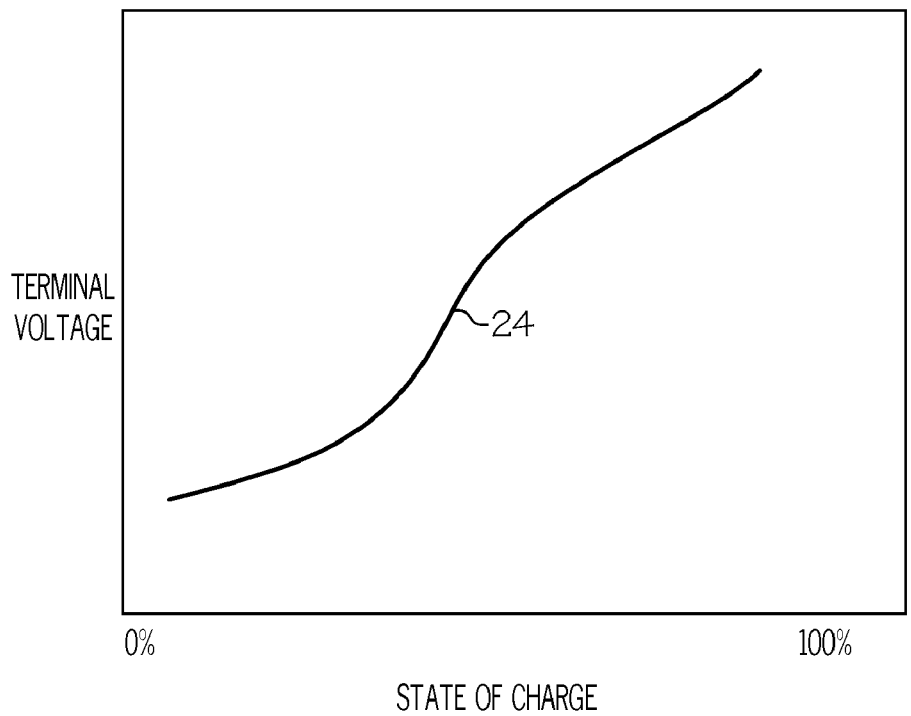
FIG. 2 shows a graph of the charge characteristics of the SOC versus the terminal voltage.

Referring to FIG. 2, there is shown a graph 24 of the state of charge over the terminal voltage of a battery (e.g., battery 10). This curve may be known for the particular battery being used or may be determined experimentally for any particular battery by methods known in the art. The SOC of the battery may be useful in determining battery charging parameters, as discussed in greater detail below.

Figure 3:
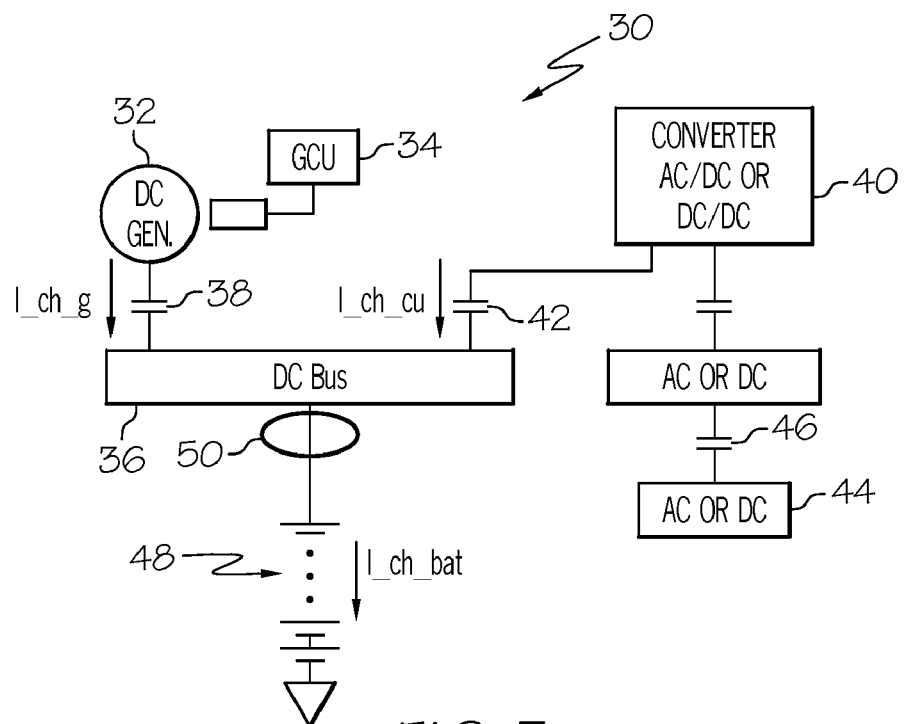
FIG. 3 shows a schematic drawing of a power system used to charge a battery according to an exemplary embodiment of the present invention.

Referring now to FIG. 3, there is shown a schematic drawing of a power system 30 including a generator 32 which may be controlled by GCU 34 and connected to a DC bus 36 by a contactor 38. To the same DC bus 36, an AC/DC or DC/DC converter 40 may be connected via contactor 42. The converter 40 may be powered by an external power source (not shown) or by a vehicle internal source 44 via contactor 46. The Li-ion battery 48 may be connected to the DC bus 36 via a contactor (not shown) or directly. The DC bus 36 may be powered by the DC generator 32 or by converter 40 or by both, generator 32 and converter 40. The generator output voltage may be controlled by the generator control unit 34 and the converter 40 output voltage may be internally controlled. The charge current magnitude may be measured by a current sensor 50 and reported to the GCU 34 and converter 40.

A charging method may be based on the charging current of the battery 48 as measured via the current sensor 50. The value of this current may be sensed by the generator control unit 34 if the generator 32 is supplying the DC bus 36, or to the converter 40 that may supply the DC bus 36. The GCU 34 and the converter 40 controls may include a control loop (not shown) for the regulation of the current. For example, during commencing of the starting of charging the battery 48, the charging current may be regulated to a predetermined value. This action may be achieved via decreasing the voltage level on the DC bus 36; this action (current limit via voltage control) may be integrated as an independent control loop in the generator GCU or converter circuitry.

Figure 4:
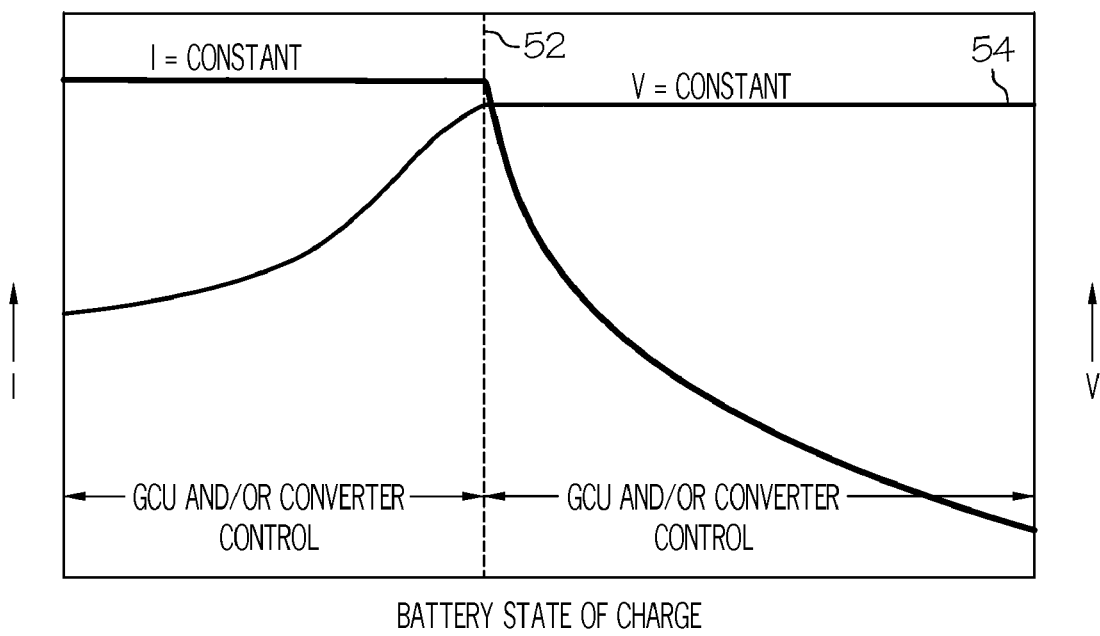
FIG. 4 shows a graph of charge characteristic achieved utilizing the system and method according to an exemplary embodiment of the present invention.

Referring now to FIGS. 3 and 4, the voltage level on the DC bus 36 may be permitted to be in an allowed range, typically between 22V to 30V for certain ground vehicles. Therefore, if a value of 23V is required to restrain the voltage to obtain a prescribed constant charging current, lowering the voltage level on the DC bus 36 to this level may still be high enough to continue to supply power to the other loads fed from the same DC bus 36. While charging the battery 48 under constant current, due to the fact that the internal impedance of the battery increases in the process, the voltage on the DC bus 36 should be increased. When reaching the nominal value (shown as dotted line 52 in FIG. 4), the voltage may be controlled to the nominal constant value 54 as required by the DC bus 36 and also compatible with the continuation of the charging process. Due to the fact that the battery internal impedance continues to increase, the charging current may decrease. In this way, a constant current—constant voltage charging algorithm may be created. When the charging current decreases to a value of about 1% of the battery C1 value (the nominal amp-hour capacity of the battery), the GCU 34 or the converter 40 controls may take action to decrease the output voltage so that the charging current is interrupted.

In addition to the above basic charging algorithm, safety monitoring related to temperature and balancing of the battery cells may be executed at the battery level. The results of the monitoring may be passed to the GCU 34 and the converter 40 so that higher level actions may be taken at this level (i.e., drop voltage, disconnect of battery from the bus, etc.) in order to preserve the battery and its safety of operation FIG. 4 shows the charge characteristic achieved with the combined control of the generator 34 and/or converter 40 output voltage. When connecting an 'empty' battery 48, its internal impedance may be minimal. Therefore, the tendency is that the charge current, without limitations, will rise to very high values. Therefore if the output voltage of the generator 32 is adjusted to a lower value via the GCU 34 or the output value of the converter 40 is adjusted to a lower value via its internal control circuitry, a lower charge current may be achieved. Via the design of the internal control loops (not shown) of the GCU 34 and converter 40, the constant current—constant voltage characteristic of FIG. 2 can be achieved.

Figure 5:
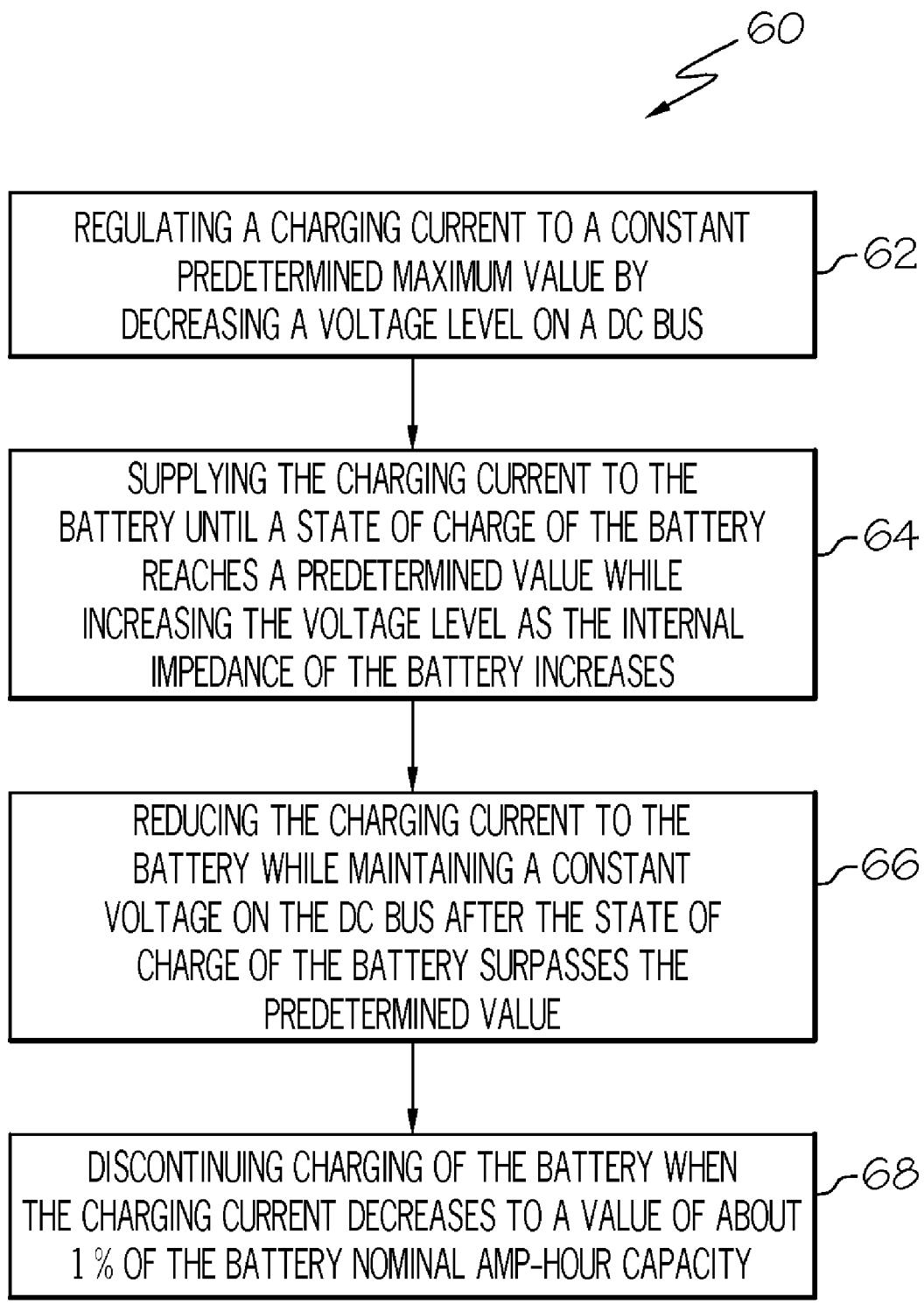
FIG. 5 shows a flow chart describing a method according to an exemplary embodiment of the present invention.

Referring to FIG. 5, there is shown a method 60 for charging a battery (e.g., battery 48). In a step 62, a charging current may be regulated to a constant predetermined maximum value by decreasing a voltage level on a DC bus (e.g., DC bus 36). In a step 64, the charging current may be supplied to the battery until a state of charge of the battery reaches a predetermined value (e.g., nominal value 52) while increasing the voltage level as the internal impedance of the battery increases. In a step 66, the charging current to the battery may be reduced while maintaining a constant voltage on the DC bus after the state of charge of the battery surpasses the predetermined value. In a step 68 charging of the battery may be discontinued when the charging current decreases to a value of about 1% of the battery nominal amp-hour capacity (or about 1% of the battery's C1 value).

It should be understood, of course, that the foregoing relates to exemplary embodiments of the invention and that modifications may be made without departing from the spirit and scope of the invention as set forth in the following claims.

We claim:

1. An apparatus for monitoring and charging a battery in an integrated power system, the apparatus comprising:

a direct current (DC) bus electrically connected to the battery;
a DC generator electrically connected to the DC bus;
a generator control unit adapted to regulate the output voltage of the generator;
a converter electrically connected to the DC bus; and
a plurality of current sensors positioned between the DC bus and the battery, wherein:
at least one of the generator control unit and the converter is configured to supply a constant current to the battery by varying the voltage of the DC bus, based at least partly on current sensed by the plurality of current sensors, wherein the voltage of the DC bus is varied between twenty-two and thirty volts,
the battery is charged while floating on the DC bus, and
a dedicated battery charger is not required to charge the battery.

2. The apparatus of claim 1, further comprising an external power source to supply power to the converter.

3. The apparatus of claim 1, further comprising:
a DC generator contactor for electrically disconnecting the DC generator from the DC bus; and
a converter contactor for electrically disconnecting the converter from the DC bus.

4. The apparatus of claim 1, further comprising a computational device for monitoring the battery temperature and for balancing cells of the battery.

5. The apparatus of claim 1, wherein the battery is charged to about 1% of the battery nominal amp-hour capacity before battery charging is discontinued.

6. An apparatus for monitoring and charging a battery in an integrated power system, comprising:
an external power source providing a first source of power;
a converter connected to said first power source to convert the external power source into a direct current;
a direct current bus connected to the converter to receive the first source of power;
a direct current generator also connected to the direct current bus providing a second source of power; and
a generator control unit connected to the direct current generator to control the second source of power;
wherein a charging algorithm used to charge the battery is implemented in the generator control unit or said converter, or both,
wherein the charging algorithm determines whether the battery is in a first range of a state of charge or a second/final range of a state of charge,
wherein the charging algorithm varies a direct current bus voltage based at least partly on a current measured by a plurality of current sensors connected to the direct current bus to provide a constant charging current to the battery in the first range of the state of charge of the battery, wherein the direct current bus voltage is varied within a range between twenty-two and thirty volts,
wherein the charging algorithm maintains a constant direct current bus voltage to decrease the charging current to the battery in the second/final range of the state of charge of the battery, and
wherein the charging algorithm discontinues charging the battery after the charging current decreases to a predetermined minimum in the second/final range of the state of charge of the battery.

7. The apparatus of claim 6, wherein the charging algorithm controls an output of the direct current generator or an output of the converter, or both, to provide the constant charging current to the battery.

8. The apparatus of claim 6, further comprising a current sensor positioned between the direct current bus and the battery, wherein the current sensor sends a signal to the generator control unit, thereby regulating the charging current supplied to the battery.

9. The apparatus of claim 6, wherein the battery is charged directly while floating on the direct current bus.

10. The apparatus of claim 6, wherein a dedicated charger is not used to charge the battery.

11. A method for charging a battery in an integrated power system, the method comprising:
regulating a charging current to a constant predetermined maximum current value by varying a voltage level on a direct current (DC) bus, in a range between twenty-two and thirty volts, during a first predetermined state of charge range, the regulating being based at least partly on a current sensed by a plurality of current sensors coupled to the DC bus;
supplying the charging current to the battery until a state of charge of the battery reaches a predetermined state of charge (SOC) value while increasing the voltage level as the internal impedance of the battery increases;
reducing the charging current to the battery while maintaining a constant voltage on the DC bus through an entire final predetermined state of charge range after the state of charge of the battery surpasses the predetermined SOC value; and
discontinuing charging of the battery when the charging current in the final predetermined state of charge range decreases to a value of about 1% of the battery nominal amp-hour capacity.

12. The method of claim 11, further comprising controlling the charging current supplied to the battery with a generator control unit.

13. The method of claim 11, further comprising controlling the charging current supplied to the battery with a converter.

14. The method of claim 11, wherein the charging of the battery is done while the battery is floating on the DC bus.

15. The method of claim 11, wherein the charging of the battery is done without a dedicated charger.

* * * * *